US008779661B2

(12) United States Patent
Bain Smith

(10) Patent No.: US 8,779,661 B2
(45) Date of Patent: Jul. 15, 2014

(54) LIQUID COOLED SEMI CONDUCTOR

(76) Inventor: James Bain Smith, Ashford (GB)

( * ) Notice: Subject to any disclaimer, the term of this patent is extended or adjusted under 35 U.S.C. 154(b) by 155 days.

(21) Appl. No.: 13/578,345

(22) PCT Filed: Feb. 21, 2011

(86) PCT No.: PCT/GB2011/000237
§ 371 (c)(1), (2), (4) Date: Aug. 10, 2012

(87) PCT Pub. No.: WO2011/104499
PCT Pub. Date: Sep. 1, 2011

(65) Prior Publication Data

US 2012/0299475 A1 Nov. 29, 2012

(30) Foreign Application Priority Data

Feb. 23, 2010 (GB) .................................. 1002989.0

(51) Int. Cl.
*H01L 33/64* (2010.01)
*H01L 33/60* (2010.01)
*H01L 33/62* (2010.01)

(52) U.S. Cl.
USPC ............................................ 315/50; 315/113

(58) Field of Classification Search
None
See application file for complete search history.

(56) References Cited

U.S. PATENT DOCUMENTS

| | | | | |
|---|---|---|---|---|
| 6,541,924 | B1 * | 4/2003 | Kane et al. | 315/246 |
| D560,016 | S | 1/2008 | Arndt et al. | |
| D592,320 | S | 5/2009 | Arndt et al. | |
| D600,369 | S | 9/2009 | Arndt et al. | |
| 8,547,037 | B2 * | 10/2013 | Yatsuda et al. | 315/309 |
| 2002/0149312 | A1 | 10/2002 | Roberts et al. | |
| 2004/0004435 | A1 | 1/2004 | Hsu | |
| 2004/0183461 | A1 * | 9/2004 | Kane et al. | 315/219 |
| 2005/0127807 | A1 | 6/2005 | Arndt et al. | |
| 2008/0013316 | A1 | 1/2008 | Chiang | |
| 2009/0102386 | A1 * | 4/2009 | Finkle | 315/117 |
| 2009/0273921 | A1 | 11/2009 | Chiang | |
| 2009/0273924 | A1 | 11/2009 | Chiang | |
| 2009/0309473 | A1 | 12/2009 | Lenk et al. | |
| 2010/0061103 | A1 | 3/2010 | Arndt et al. | |
| 2010/0134017 | A1 * | 6/2010 | Yatsuda et al. | 315/113 |

FOREIGN PATENT DOCUMENTS

| | | |
|---|---|---|
| DE | 541952 | 1/1932 |
| DE | 10 2004/015102 | 10/2005 |
| DE | 10 2005/017751 | 10/2006 |

* cited by examiner

*Primary Examiner* — Crystal L Hammond
(74) *Attorney, Agent, or Firm* — Sue Z. Shaper

(57) ABSTRACT

An electric light having a semiconductor mounted to a base (6). The semiconductor, preferably a LED is at least partly surrounded by a liquid container (18), which is filled with liquid such that the liquid is in thermal conducting path with the liquid and the base. The light emitted from the semiconductor passes through the liquid. An electronic ballast (16) is provided in the base between supply contacts (8) and semi conductor (2).

17 Claims, 2 Drawing Sheets

Fig. 6
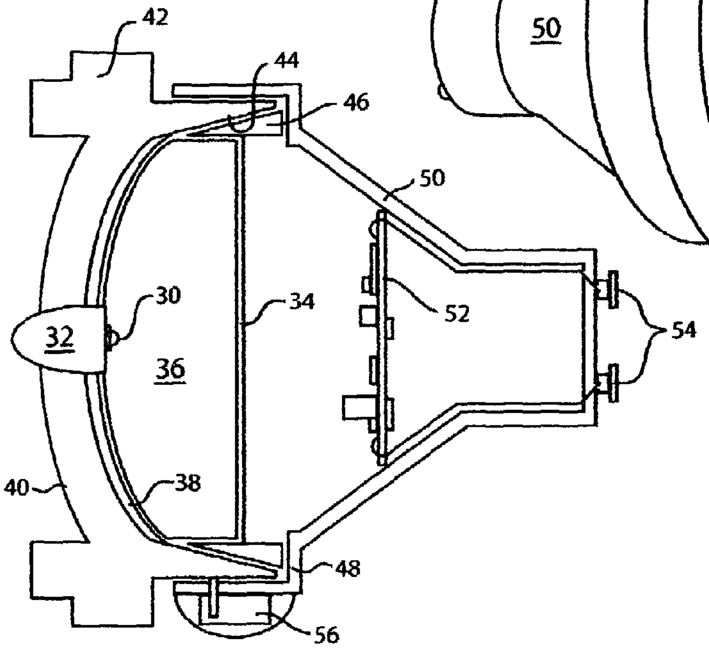
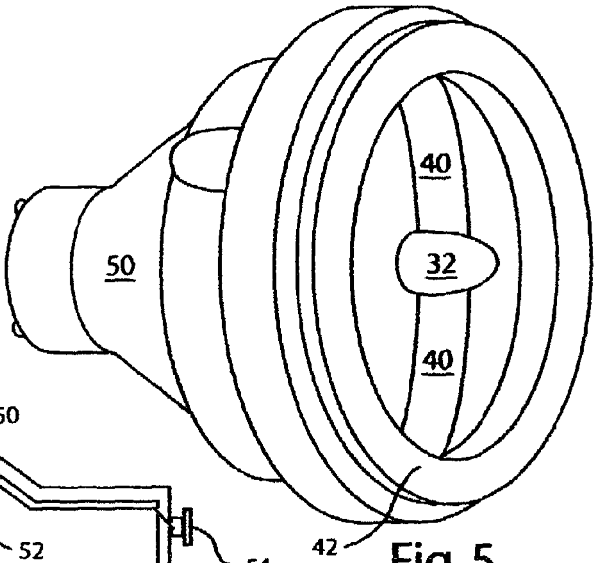
Fig. 5
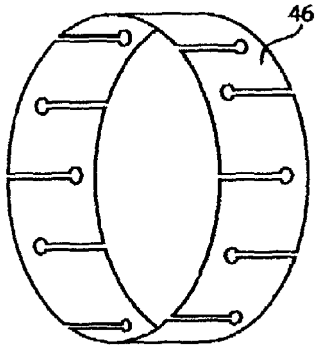
Fig. 8
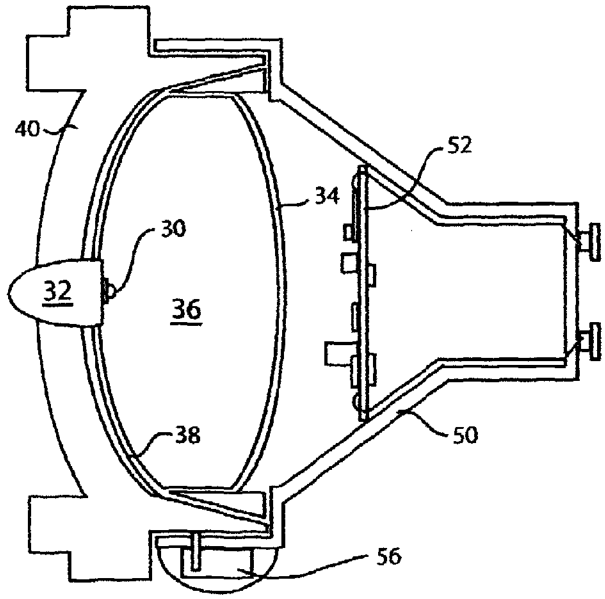
Fig. 7

LIQUID COOLED SEMI CONDUCTOR

The present invention relates to electric light lamps. For many years incandescent lamps in which a tungsten filament is heated by means of an electrical current have been used domestically. The light emitted is quite pleasant but their efficiency is low about at 12 lm/w. High efficiency lamps such as low pressure sodium lamps used for street lighting have achieved 200 lm/w but these are large, expensive to manufacture and the light they produce tending to be colour-biased and is unsuitable for domestic use. Although there have been recent improvements in life expectancy, they generally do not last as long as their cost would justify. In order to increase efficiency and attempt to provide a suitable domestic lamp fluorescent lamps have been developed which when new produce some 100 lm/watt. However these tend to deteriorate rapidly, they are slow to warm up to an adequate light output and are clumsy, bulky and therefore lack elegance for domestic use. They are expensive to power if switched on and off frequently. This also reduces life expectancy. Fluorescent lamps are subject to disposal restriction and can cause health problems Recent improvements in semiconductor optoelectronics are such that light emitting diodes used for small warning lights or indicators where a small light output is produced are now increasing in power and light output. Furthermore efficiency previously quite low is improving so that Cree Inc (Cree is a RTM) of Durham N.C., USA claim that they have broken through the 200 lm/w bather to produce a 208 lm/w efficiency using a drive current of 350 mA at 230/240 v. Semiconductor light emitters currently on sale use a drive current of about 22.5 mA at similar voltages and produce about 215 lm. That is about half the theoretical light output for half the power input of an 8 w florescent domestic lamp (40 w incandescent equivalent). It is arguable therefore that the efficiency of modern light emitting diodes (LED is similar to that of fluorescent lamps. However since fluorescent lamps deteriorate faster than LEDs and LEDs need less power to start LEDs are rapidly overtaking fluorescent lamps in efficiency.

A problem with semi-conductor light emitters is however, that the semi conductor elements are sensitive to heat and therefore require to be kept, for instance at a base temperature below 70° c when operating to maintain a maximum junction (that is chip) temperature of say 90° c. It should be noted that as junction temperatures relative luminous flux decreases significantly when temperatures exceed 90° c. As a result of the temperature problems with LEDs it has been necessary to keep device power low and to provide a large heat sink. For these reasons it has not been practical up to now to use semiconductor devices instead of fluorescent lamps. It is an object of the present invention to overcome problems associated with semiconductors in order to produce a lamp with a better performance than existing incandescent and florescent lamps.

An electric light according to the invention accordingly comprises a light emitting semiconductor mounted to a base, the semiconductor being electrically connected to electrical supply contacts and being at least partly surrounded by a liquid container having a cooling liquid therein such that the semiconductor is in a thermal conducting path with the liquid and the base, the liquid and container being so arranged that light emitted from the semiconductor passes through the liquid and container, wherein the semiconductor is mounted within an inner capsule within the container and wherein an electronic ballast is provided wholly within the base between the supply contacts and semiconductor.

An advantage of the invention is that the container's exterior surface can be made large enough to mostly cool the semiconductor leaving the base capacity the remaining undesirable heat in order to prevent excessive junction temperatures.

The semiconductor (hereinafter the SCD) is suitably mounted to a post and thence to the base arranged to act as a heat sink, which is preferably formed of thermally conductive material at least in a region of the lamp adjacent to a socket into which it is designed to fit. Preferably the region provides space for the electronic ballast.

The liquid container is preferably profiled with a pattern and preferably formed both inside and outside with a textured or Fresnel surface so as to increase the surface area of the container and thence heat emission. This enables the lamp wattage to be increased. The SCD is preferably a LED.

According to a further embodiment of the invention the semiconductor is mounted to the base so as to emit light through the liquid rearwardly onto a reflector and thence forwardly past the semiconductor. This spreads tight from the emitter, avoids glare and reduces the risk of retinal damage. The reflector may be flexible so as to change the focus of the reflector.

Embodiments of the invention will now be described by way of example with reference to the accompanying drawings in which:

FIG. 5 is a perspective view of a fourth embodiment of the invention.

FIG. 6 is a cross section of the fourth embodiment

FIG. 7 is a cross section of the fourth embodiment with it's reflector refocused and FIG. 8 is a perspective view of a part of the fourth embodiment Light Emitting Diodes (LEDs) being semiconductor devices (SCDs) come in several forms for instance RGB (red green and blue coloured) LEDs, phosphor based LEDs, organic LEDs (OLEDs) Quantum dot LEDs and high power LEDs and PLEDs.

Figure 1:
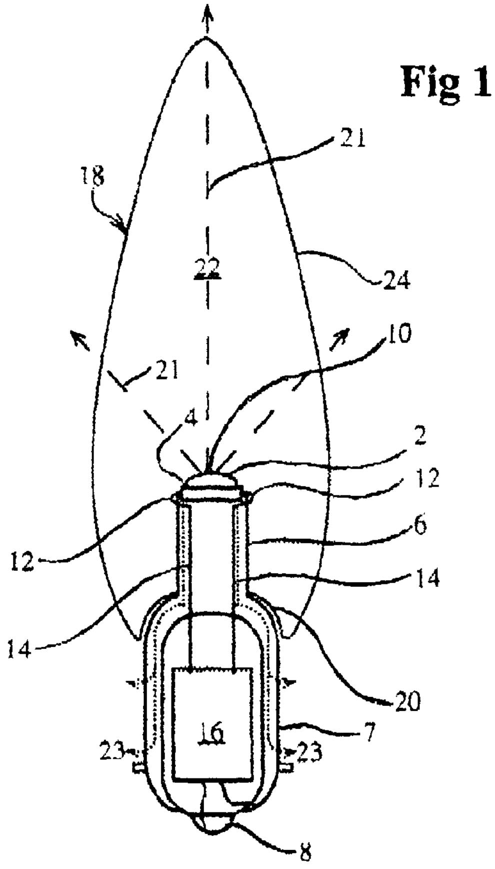
FIG. 1 is a diametrical cross sectional elevation of a lamp according to the first embodiment of the invention.

FIG. 1 shows a lamp having a LED chip 2 mounted on a header 4, which in turn is mounted on a heat sink 6 formed as a post. The post continues downwards to form a base and on which base there is a bayonet or Edison connection (diagrammatically shown as a bayonet connection). Supply contacts 8 (only one shown) are provided at the bottom of the base. The LED chip is sealed within a translucent capsule 10. Electrical connections 12 for the LED are connected by means of leads 14 to capacitor and ballast 16 and thence to the supply contacts 8

Mainly surrounding the encapsulated LED 2 and post 6 is a container formed as an impervious envelope of thermally conductive translucent plastics material, which is sealed to post 6 at 20. The container 18 is filled with a substantially colourless liquid 22 such as a glycerol water mix.

Figure 2:
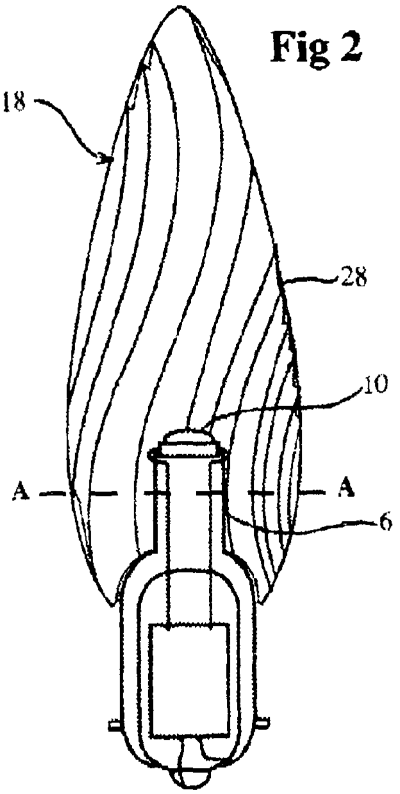
FIG. 2 is a similar cross section to FIG. 1 according to a second embodiment of the invention.
Figure 3:
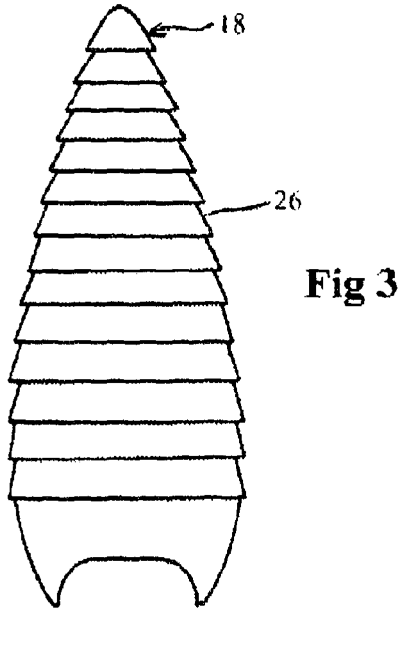
FIG. 3 is a similar cross section to FIG. 1 according to a third embodiment of the invention and FIG. 4 is cross section taken on AA of FIG. 2
Figure 4:
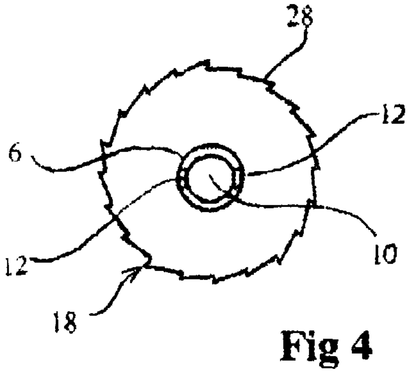

FIG. 1 shows the outer surface 24 of the container as being smooth. However, it is advantageous to increase the surface of the surface 24 by profiling it either with a Fresnel pattern as shown in FIG. 3 or an axially aligned curved and twisted pattern 28 as shown in FIGS. 2 and 4. The patterns 26 and 28 are formed both on the inside and outside of container 18 so that the maximum cooling effect is achieved.

Although most of the cooling of LED 2 is achieved by the thermal passage 21 through the liquid 22, a minor amount is able to escape down a passage 23 through post 6 into and out of a thermally conductive material around ballast 16 in the base 7.

Whilst connections 12 for the LED pass through a liquid that is not electrically conductive, it is desirable to coat the metal of the connections to prevent any metal leaching into the surrounding liquid.

Colouring of the lamp may be achieved by varying the composition of the semi conductive material of the LED in a known way and LEDs lend themselves to tailoring the light output for particular uses.

In a fourth embodiment of the invention shown in FIGS. 5 to 8 a LED 30 is mounted on a central boss 32 so as to shine rearwardly onto a flexible reflector 34 through a liquid filled container 36 whose front is enclosed by a translucent screen 38. Boss 32 is supported by a pair of diametrically opposite arms 40 (in order to disperse more heat a further pair of arms 40 might be provided) which are in thermal conductivity path from the LED to an outer ring 42 which fits by means of a chamfered face 44 on ring 42 to a chamfered collar 46 which sits in a recess 48 in a base 50. Base component 50 houses ballast 52. Supply contacts are shown representationally at 54.

In order to cause ring 42 to move towards or away from 50 a stepper motor or other purely mechanical means 56 is provided. The result of moving ring 42 towards base 50 causes the reflector 34 to bend thus sharpening the focus as is shown in FIG. 7.

Heat dispersion from the LED is maintained by means of the liquid both forwardly and sideways to the sideways to the surrounding parts. More heat is dispersed from boss 32 on which is mounted LED 30 through arms 40, ring collar 46 and eventually residually to the base by which time most of the heat from the LED has been dispersed.

What is claimed is:

1. An electric light lamp comprising in combination:

(i) a base to which are mounted electrical supply contacts for the lamp, (ii) a ballast mounted within the base, (iii) electrical supply leads extending from the contacts to the ballast, (iv) a post extending axially from the base, (v) a light emitting semiconductor sealed within an at least partly translucent capsule mounted to the post and connected electrically through the post to the ballast, (vi) the capsule being at least partly surrounded by a thermally conductive translucent liquid container mounted to the base, (vii) heat conducting liquid filling the container to provide a first thermal passage from the chip through the liquid to the exterior of the container, (viii) thermally conductive material being provided around the ballast and along the post so as to provide a second thermal passage from the semiconductor along the post to the base, whereby heat from the semiconductor is enabled to escape from the lamp partly through the container and partly through the base.

2. A lamp as claimed in claim 1 wherein the container is profiled with a pattern.

3. A lamp as claimed in claim 2 wherein the container is formed inside and outside with a Fresnel surface.

4. A lamp as claimed in claim 2 wherein the container is formed inside and outside with a textured surface.

5. A lamp as claimed in claim 1 wherein the base is formed at least partly of thermally conductive material in a region of the lamp arranged to be adjacent to a socket into which it is designed to fit.

6. A lamp as claimed in claim 1 wherein the liquid is glycerol.

7. A lamp as claimed in claim 1 wherein the liquid is a glycol water mixture.

8. A lamp as claimed in claim 1 wherein the post continues towards the supply contacts to form the base.

9. An electric light lamp comprising in combination:

(i) a base to which are mounted electrical supply contacts for the lamp, (ii) a ballast mounted within the base, (iii) electrical leads extending from the contacts to the ballast, (iv) a reflector mounted to the base, (v) thermally conductive arm means extending from the base forwardly of the reflector, (vi) a liquid container filled with a heat conductive liquid formed between a translucent screen and the reflector, (vii) a light emitting semiconductor sealed within an at least partly translucent capsule mounted to the arm means facing the base so as to emit light rearwardly through the container onto the reflector and thence forwardly through the screen past the capsule.

10. A lamp as claimed in claim 9 wherein the semiconductor is mounted so as to be moveable towards or away from the reflector.

11. A lamp as claimed in claim 9 wherein the reflector is flexible and wherein means are provided to change the shape of the reflector to alter its focal length.

12. A lamp as claimed in claim 11 wherein the means for changing the shape of the reflector comprises a means to apply pressure on the liquid in the container whereby the volume inside the container is increased.

13. A lamp as claimed in claim 9 wherein the arm means is connected to a ring so as to provide a thermally conductive path from the semiconductor to the ring, the ring being mounted to the base.

14. A lamp as claimed in claim 13 wherein the ring is controllably moveably mounted so as to be able to be moved towards or away from the base.

15. A lamp as claimed in claim 9 wherein a first thermal passage is provided from the semiconductor through the arm means and a second thermal passage is provided through the liquid in the container.

16. An electric light lamp comprising a light emitting semiconductor in a capsule mounted to a base by means of at least one thermally conductive arm, the capsule being at least partly surrounded by a container of thermally conductive liquid, the semiconductor facing a reflector mounted to the base so that light from the semiconductor is able to pass through the container onto the reflector and back through the container.

17. A lamp as claimed in claim 16 wherein the reflector is flexible so that its shape may be altered to adjust its focal length.

* * * * *